(12) United States Patent
Klingspor et al.

(10) Patent No.: US 10,908,205 B2
(45) Date of Patent: Feb. 2, 2021

(54) METHOD AND A DEVICE FOR DETERMINING A SWITCHING CURRENT OF A CONVERTER OF A SYSTEM FOR INDUCTIVE POWER TRANSFER AND A METHOD OF CONTROL

(71) Applicant: Bombardier Primove GmbH, Berlin (DE)

(72) Inventors: Alexander Klingspor, Karlsruhe (DE); Eric Velte, Lampertheim (DE)

(73) Assignee: Bombardier Primove GmbH, Berlin (DE)

( * ) Notice: Subject to any disclaimer, the term of this patent is extended or adjusted under 35 U.S.C. 154(b) by 0 days.

(21) Appl. No.: 16/461,979

(22) PCT Filed: Nov. 28, 2017

(86) PCT No.: PCT/EP2017/080679
§ 371 (c)(1),
(2) Date: May 17, 2019

(87) PCT Pub. No.: WO2018/099911
PCT Pub. Date: Jun. 7, 2018

(65) Prior Publication Data
US 2019/0324076 A1   Oct. 24, 2019

(30) Foreign Application Priority Data

Nov. 29, 2016 (GB) .................................. 1620197.2

(51) Int. Cl.
*H02M 1/08* (2006.01)
*G01R 31/26* (2020.01)
(Continued)

(52) U.S. Cl.
CPC ....... *G01R 31/2617* (2013.01); *G01R 15/181* (2013.01); *G01R 19/16547* (2013.01);
(Continued)

(58) Field of Classification Search
None
See application file for complete search history.

(56) References Cited

U.S. PATENT DOCUMENTS 7,804,288 B2   9/2010 Ollila et al.
2005/0281067 A1*  12/2005 Deng ................ H02M 7/53875
                                                           363/131
(Continued)

FOREIGN PATENT DOCUMENTS

EP   1936794 A2   6/2008
EP   2895350 A2   7/2015

OTHER PUBLICATIONS

Covic, et al., "A Three-Phase Inductive Power Transfer System for Roadway-Powered Vehicles", IEEE Transactions on Industrial Electronics, 2007, p. 3370-3378, vol. 54:6.

*Primary Examiner* — Jeffrey A Gblende
(74) *Attorney, Agent, or Firm* — The Webb Law Firm (57) ABSTRACT

A method for determining a switching current of at least one switching element of a converter of a system for inductive power transfer, including determining a phase current of at least one AC phase line of the converter; determining at least one switching time point of the at least one switching element and the phase current value at said switching time point; and determining switching current of the at least one switching element depending on the at least one phase current value.

17 Claims, 3 Drawing Sheets

(51) Int. Cl.
  *H02J 50/10* (2016.01)
  *G01R 15/18* (2006.01)
  *G01R 19/165* (2006.01)
  *H02M 7/5387* (2007.01)
  *B60L 53/20* (2019.01)
  *H02M 1/00* (2006.01)

(52) U.S. Cl.
  CPC ............... *H02J 50/10* (2016.02); *H02M 1/08* (2013.01); *H02M 7/53871* (2013.01); *B60L 53/20* (2019.02); *B60L 2210/30* (2013.01); *B60L 2210/42* (2013.01); *B60L 2240/429* (2013.01); *H02M 2001/0009* (2013.01)

(56) References Cited

U.S. PATENT DOCUMENTS

| | | |
|---|---|---|
| 2010/0123418 A1 | 5/2010 | Itoh et al. |
| 2011/0050154 A1* | 3/2011 | Farr .................. H02H 3/006 318/778 |
| 2013/0214710 A1 | 8/2013 | Omata et al. |
| 2013/0320903 A1* | 12/2013 | Aalund ............... G01R 31/343 318/490 |
| 2014/0062356 A1 | 3/2014 | Djonga et al. |
| 2014/0293670 A1 | 10/2014 | Robertson et al. |
| 2015/0003115 A1* | 1/2015 | Barron .................. H02M 1/08 363/17 |
| 2015/0207335 A1 | 7/2015 | Madawala et al. |
| 2015/0217646 A1 | 8/2015 | Safaee |
| 2015/0256105 A1* | 9/2015 | Kano ................... H02M 7/537 307/10.1 |
| 2016/0301250 A1 | 10/2016 | Woronowicz et al. |

\* cited by examiner

METHOD AND A DEVICE FOR DETERMINING A SWITCHING CURRENT OF A CONVERTER OF A SYSTEM FOR INDUCTIVE POWER TRANSFER AND A METHOD OF CONTROL

A method and a device for determining a switching current of a converter of a system for inductive power transfer and a method of control

CROSS-REFERENCE TO RELATED APPLICATIONS

This application is the United States national phase of International Application No. PCT/EP2017/080679 filed Nov. 28, 2017, and claims priority to United Kingdom Patent Application No. 1620197.2 filed Nov. 29, 2016, the disclosures of which are hereby incorporated by reference.

BACKGROUND OF THE INVENTION

Field of the Invention

The present disclosure relates to a method and a device for determining at least one switching current of at least one switching element of a converter. The converter is a converter of a system for inductive power transfer, in particular a converter for providing an AC operating voltage for a primary winding structure of said system. Further, the present disclosure relates to a method for controlling an operation of a switching element of said converter.

Technical Considerations

Electric vehicles, in particular a track-bound vehicle, and/or a road automobile, can be operated by electric energy which is transferred by means of an inductive power transfer. Such a vehicle may comprise a so-called receiving device adapted to receive an alternating electromagnetic field and to produce an alternating electric current by electromagnetic induction. Such a receiving device can comprise or provide a so-called secondary winding structure. Furthermore, such a vehicle can comprise a rectifier adapted to convert an alternating current (AC) to a direct current (DC). The DC can be used to charge a traction battery or to operate an electric machine. The rectifier converts the AC provided by the receiving device into the DC.

The inductive power transfer is usually performed using a primary unit which generates the alternating electromagnetic field by a primary winding structure and a secondary unit which comprises the receiving device for receiving said electromagnetic field. The primary unit and the secondary unit can e.g. each comprise a set of windings providing the aforementioned primary and secondary winding structure.

A set of windings of the primary unit which can also be referred to as primary windings or primary winding structure can be installed on the ground and can be fed by a wayside power converter (WPC), in particular by an inverter. A set of windings of the secondary unit which can also be referred to as secondary windings or secondary winding structure is installed on the vehicle. For example, the secondary winding structure can be attached underneath the vehicle, in the case of trams under some of its wagons. The first and the secondary side can be part of a high frequency transformer to transfer electric energy to the vehicle. This transfer can be done in a static state (when there is no movement of the vehicle) and in a dynamic state (when the vehicle moves).

The converter provides an AC operating voltage to the primary winding structure in order to generate the electromagnetic field for power transfer. A converter provided by an inverter can have DC input terminals which are connected to a DC power or voltage supply. Further, the inverter can have AC output terminals to which the primary winding structure, in particular phase lines of the primary winding structure, is/are connected.

SUMMARY OF THE INVENTION

It is desirable to avoid a so-called capacitive switching of switching elements of the converter which provides said AC operating voltage for the primary winding structure. Such a capacitive switching occurs if a phase current which flows from or through the switching element into an AC phase line at the switching time point is zero or negative. The phase current can denote the current provided at an AC output terminal of the converter.

In the case of capacitive switching, the so-called reverse recovery effect can lead to high compensating currents for changing the charging state of the switching element and a bypass diode which is usually connected in parallel to said switching element. These high compensating currents, in turn, can generate undesired power losses, undesired heat and also decrease the efficiency of power transfer. Thus, it is desirable to control an operation of the converter such that the switching currents of at least one switching element are non-capacitive, i.e. positive when the switching element is closed (switching on), and negative when the switching element is opened (switching off).

Due to the high operating frequency in the range of 80 kHz to 90 kHz, a rather high sampling frequency for measuring the phase current is needed, in particular a sampling frequency higher than 500 kHz for also measuring certain harmonics of the phase current. Such a high sampling rate, however, may require a high amount of computing power.

There is the technical problem of providing a method and a device for determining a switching current of at least one switching element of a converter of a system for inductive power transfer and a method for controlling an operation of the converter which allow a precise, fast and computational efficient determination of the switching current.

The solution to said technical problem is provided by the subject-matter of the present disclosure.

In some non-limiting embodiments, the present disclosure includes a method for determining at least one switching current of at least one switching element of a converter is proposed. The converter is a converter of a system for inductive power transfer, in particular to a vehicle. Moreover, a converter can provide an alternating operating voltage to a primary winding structure of the system for inductive power transfer in order to generate the electromagnetic power transfer field.

In some non-limiting embodiments, the primary winding structure can be a three phase winding structure. In this case, the inverter can be a three phase converter. In particular, a three phase inverter can have a so called B6 bridge topology. In particular, the inverter can comprise at least one leg with series connection of two switching elements. A high potential terminal of a first switching element of the series connection can be connected to a high potential DC phase line. A second terminal of the first switching element can be connected to a first terminal of the second switching element. A second terminal of the second switching element can be electrically connected to a low potential DC phase line. An AC phase line of the inverter can be electrically connected to the connecting section of the first and second switching element. A phase line of the primary winding structure can be connected to at least one AC phase line of the inverter. If the inverter is a three phase inverter, the inverter can comprise three legs with such a series connection of switching elements and three AC phase lines of the inverter. A switching element can preferably be a MOSFET. Alternatively, a switching element can be provided by an IGBT.

In some non-limiting embodiments, a converter can also have one or more AC phase lines which provide an AC output voltage for operating the primary winding structure. The converter can be a one-phase or a multiple-phase, in particular a three-phase converter. In case of a three-phase converter or inverter, the converter or inverter can have a so-called B6 topology.

In some non-limiting embodiments, at the phase line, AC phase voltage and the AC phase current are provided. The phase current can denote an AC output current of the converter if the converter provides an AC operating voltage to the AC phase line and thus to a primary winding structure connected to said AC phase line. The AC phase current can e.g. be the current flowing through a switching element of a converter leg into the respective phase line. The phase voltage can denote the voltage between the potential of the AC phase line and a reference potential.

In some non-limiting embodiments, the method comprises the step of determining a phase current of at least one AC phase line of the converter.

In some non-limiting embodiments, a time course of the phase current can be determined, e.g. measured or calculated based on quantities different from the phase current. It is for instance possible to sample the analogue time course of the phase current, wherein each sample represents a value of the phase current at the respective sampling time point. In this case, a sampling time point can be the assigned to each sample.

In some non-limiting embodiments, at least one switching time point of the at least one switching element and the phase current value at said switching time point is determined. The switching time point can denote that the point in time at which the switching element changes from a non-conductive state to a conductive state or vice versa. If the phase current is sampled, the phase current value at the switching time point can be the value of the sample at which the sampling time point corresponds to determined switching time point.

In some non-limiting embodiments, the switching current of the at least one switching element is determined depending on the at least one phase current value at the switching time point. In particular, the phase current value can be determined as a digitized phase current value, wherein an analog value of the phase current at said switching time point is digitized by e.g. A/D converter. Then, the switching current is determined depending on the at least one digitized phase current value.

In some non-limiting embodiments, the switching current can be equal to the determined phase current value, in particular if only one switching time point and respective phase current value is determined. It is, however, also possible to execute a pre-determined arithmetic operation to determine the switching current based on the phase current value. As will be also explained in the following, it is also possible to determine multiple, in particular successive, switching time points and thus multiple phase current values. Then, the switching current of the at least one switching element can be determined depending on these multiple phase current values.

Non-limiting embodiments of the present disclosure allow a precise and computationally efficient determination of the switching current. For example, only switching time points and the phase current values at said switching time points need to be determined for said determination of the switching current. It is not necessary to determine phase current values, in particular digitized phase current values, at all sampling time points.

In some non-limiting embodiments, the phase current is measured by a current sensor. As will be explained in the following, it is also possible to determine the phase current based on other electric parameters or quantities. The current sensor can e.g. measure the phase current in the at least one AC output phase line of the converter. Using a current sensor advantageously allows a precise and reliable determination of the phase current.

In some non-limiting embodiments, a bandwidth of the current sensor is higher than 150 kHz, preferably higher than 300 kHz, more preferably higher than 500 kHz.

Such a bandwidth advantageously allows to reliably measure the current component of the phase current with a fundamental frequency, wherein the fundamental frequency is equal to the operating frequency of the primary winding structure. In particular, an operating frequency can be in the range 80 kHz to 90 kHz, wherein the switching elements are operated such that an alternating operating voltage with said fundamental frequency is provided by the converter.

In particular, the bandwidth of the current sensor may be higher than twice the operating frequency, more preferably even higher than twice the operating frequency in order to capture also harmonic frequency components of the phase current. This, in turn, advantageously allows a more precise determination of the switching current.

In some non-limiting embodiments, the phase current is digitized by an A/D converter. In particular, values of sample points provided by the current sensor can be digitized by the A/D converter. A bandwidth of the A/D converter is smaller than the bandwidth of the current sensor. In particular, it is possible to not digitize all values sampled by the current sensor. In particular, it is possible to only digitize selected but not all phase current values, in particular the phase current value at a switching time point.

This advantageously allows using an A/D converter with a rather low performance, wherein a high computational efficiency for determining switching current is provided.

In some non-limiting embodiments, the current sensor comprises a Rogowski coil or a current transformer. In other words, the current sensor can be a Rogowski coil-based current sensor or current transformer-based current sensor. This advantageously allows to provide a current sensor with a high bandwidth.

In some non-limiting embodiments, a phase voltage change over time is determined, wherein the phase current is determined depending on the phase voltage change. It is, for instance, possible to determine a phase voltage, in particular to measure a phase voltage, e. g. by a voltage sensor. Then, phase voltage change over time can be determined, e.g. by performing an arithmetic operation.

In this embodiment, a primary winding structure can be connected to AC phase line of the converter, wherein the primary winding structure provides an inductance and the phase current can be determined depending on the phase voltage change and the inductance.

This provides an alternative determination of the phase current, in particular in cases where a phase current cannot be measured directly.

In some non-limiting embodiments, a set of at least two successive switching time points of the at least one switching element and the phase current values at said switching time points is determined. The at least two successive switching time points can be switching time points which immediately succeed each other, i.e. without a further switching time point in between the succeeding switching time points. This, however, is not mandatory.

In some non-limiting embodiments, it may be important that the set comprises two different switching time points and the corresponding phase current values. The at least one switching current is determined depending on the at least two phase current values. In particular, the switching current can be determined as the maximal phase current value of the set of at least two phase current values. However, also alternative operations for determining the at least one switching current depending the at least two phase current values can be performed. It is, for example, also possible to determine the switching current as the average value of the at least two phase current values.

It can be assumed that the control of the converter, in particular the inverter, is performed such that switching currents are equal or do not deviate more than a predetermined amount from each other for multiple duty cycles of the switching elements, i.e. multiple switching time points. Determining more than one switching time point and the corresponding phase current value can thus provide a more robust and precise determination of the switching current.

In some non-limiting embodiments, a first switching time point is determined depending on a first time point of a switch signal generation. The time point of a switch signal generation can denote the time point at which a control unit for controlling an operation of the switching element generates or transmits the switch signal to the switching element, in particular to a gate terminal of the switching element. The control unit can provide information on the time point of a switch signal generation.

In some non-limiting embodiments, at least one further switching time point is determined depending on a further time point of a switch signal generation. The first and the further switching time point can be successive switching time points and thus the time points of switch signal generation can denote successive time points of a switch signal generation.

In some non-limiting embodiments, the first switching time point can be determined as the sum of the first time point of switch signal generation and a first offset value.

In some non-limiting embodiments, the at least one further switching time point can be determined as the sum of the further time point of a switch signal generation and another offset value, wherein the other offset value is different from the first offset value. It is possible that the first offset value is zero, i.e. that the first switching time point is determined as the first time point of a switch signal generation.

In some non-limiting embodiments, a time difference between the at least one further switching time point and the further time point of a switch signal generation is different from the time difference between the first switching time point and the first time point of a switch signal generation.

In other words, the switching time point can be varied relative to the beginning of a switching cycle in different successive switching cycles. If it is assumed that the switching current is essentially equal for different switching cycles, the proposed determination of multiple switching time points allows to scan a certain time period of the switching cycle, in particular the time period following the time point of a switch signal generation.

It can be assumed that a gate time delay varies for different switching elements depending on different temperatures, different current values and different ages. The gate time delay can denote the time signal propagation delay of the switch signal between time point of switch signal generation and the actual switching operation or the reception at the gate terminal of the switching element. The aforementioned time difference between a switching time point and the time point of a switch signal generation can correspond to said gate time delay.

This, however, means that no fixed value can be determined for said gate time delay. By determining multiple switching time points and the corresponding phase current values with varying difference between the switching time points and the corresponding time point of a switch signal generation, it is advantageously possible to reduce the imprecision due to the gate time delay and to increase the preciseness of the determination of the switching current.

In some non-limiting embodiments, the time difference between a switching time point and the time point of the switch signal generation increases for successively determined switching time points. In particular, the time difference can increase by a predetermined value, in particular a predetermined time interval, e. g. a time interval of 5 ns, 10 ns or 20 ns. The time interval can however be chosen according to the specific operation scenario.

The smaller time interval of increase, the better the scan density for determining the actual switching time point and the corresponding phase current value. This, in turn, increases a preciseness of determination.

In some non-limiting embodiments, successive switching time points are determined by adding an increasing offset value to each of successively determined time points of a switch signal generation. This and corresponding advantages have been explained before.

In some non-limiting embodiments, the switching current is determined as the local maximum of the course of phase current values for or over the varying time differences. The termination of the local maximum of the phase current values thus not necessarily mean that the switching current corresponds to the maximal phase current value of the set of phase current values. It is also possible that the local maximum corresponds to a phase current value which is different, in particular higher, than the maximal value of phase current values in the set of phase current values and which corresponds to a time point located in between two successive switching time points in the set of switching time points.

Said local maximum can e. g. be determined by interpolation or any other suitable rule of calculation. This advantageously allows a very precise determination of the switching current value.

In some non-limiting embodiments, a predetermined number of successive switching time points or all switching time points in a time interval of a predetermined length are determined. The length of the time interval can e. g. chosen such that a desired predetermined number of switching cycles is performed within the time interval. In particular, more than 5, 10, 15 or more successive switching time points can be determined or the length of the time interval can be chosen accordingly. This advantageously increases a robustness and preciseness of the switching current determination.

In some non-limiting embodiments, a first switching element voltage across a first switching element in one leg of the converter and a second switching element voltage across a second switching element and said leg of the converter are determined. The switching elements can be connected in serious which has been explained before.

In some non-limiting embodiments, the first and the second switching element voltages provide input values of a XOR operation, wherein the switching time point is determined as the time point at which the output value of the XOR operation changes to a logic "1" signal. A minimum voltage of the first and the second switching element voltage can correspond to a logic "0" signal, wherein a maximal voltage of the first and second switching element voltage can correspond to a logic "1" signal or vice versa. The XOR operation can e. g. be performed by a control unit. The switching current is than determined as the phase current value at said switching time point. This advantageously allows a precise determination of the switching time point and thus a precise determination of the switching current.

In some non-limiting embodiments, predefined assignments may be used, e.g. in the form of a look-up table, of a time course of the phase current to a switching current to determine the switching current.

It is possible to establish an assignment of phase current peak values or an effective value of the phase current or a time course thereof to a switching time point, e.g. by calibration or numerical simulation. Determination of the phase current then allows the switching current to be determined based on the predefined assignment.

In some non-limiting embodiments, the phase current may be oversampled, in particular the time course of the phase current. It is possible to sample the time course with the sampling rate in between 800 kHz to 900 kHz in order to exactly determine the shape of the time course and thus exactly determine switching time points. This, however, may require a very high amount of computational power.

In some non-limiting embodiments, the present disclosure includes a device for determining a switching current of at least switching element of a converter of a system for inductive power transfer. The device advantageously allows to perform a method according to the embodiments disclosed in this disclosure. Thus, the device is designed such that such a method can be performed by the device.

In some non-limiting embodiments, the device comprises at least one means for determining a phase current of at least one AC phase line of the converter and at least one evaluation means. The evaluation means can be provided by a control unit for controlling the operation of the converter or by a unit separate of said control unit. The evaluation means can comprise or be provided by a micro-controller. The means for determining a phase current can be or comprise at least one current sensor.

In some non-limiting embodiments, a phase current of at least AC phase line of the converter is determinable, e. g. by the at least one means for determining the phase current.

In some non-limiting embodiments, at least one switching time point of the at least one switching element and the phase current value at said switching time point is determinable, e. g. by the at least one evaluation means.

In some non-limiting embodiments, the at least one switching current is determinable depending on the at least one phase current value, e. g. by the at least one evaluation means.

In some non-limiting embodiments, the device can comprise a filtering unit, in particular a low-pass filtering unit, for filtering phase current, in particular the phase current measured by a current sensor.

In some non-limiting embodiments, the device can further comprise an amplifying unit for amplifying the phase current in particular the phase current measured by current sensor or the phase current filtered by a filtering unit. Further the device can comprise a memory unit for storing the switching time point (s) and the corresponding phase current value (s). The proposed device advantageously allows to perform the proposed method for determining the switching current.

In some non-limiting embodiments, the device comprises a current sensor, in particular a current sensor comprising a Rogowski coil or a current transformer. Alternatively or in addition, the device comprises at least one means for determining a phase voltage change over the time. In the latter case, the device can comprise at least one means for determining the phase current depending on the phase voltage change over time, e.g. the evaluation unit. This and corresponding advantages have been explained before.

In some non-limiting embodiments, the device further comprises a control unit for generating switching signals for the at least one switching element. The control unit can e. g. be the control unit for controlling the operation of the converter. Further, the control unit can provide the aforementioned evaluation means or can be connected to at least one evaluation unit providing the evaluation means by a signal connection.

This advantageously allows to determine the switching time points based on the time point of switch signal generation. This and corresponding advantages have been explained before.

In some non-limiting embodiments, the device comprises at least one means for determining a first switching element voltage across a first switching element in one leg of the converter and for determining a second switching element voltage across second switching element in said leg of the converter. The means can e. g. be provided by one or more voltage sensor(s). Further, the switching current is determinable based on the first and the second switching element voltages as explained before.

In some non-limiting embodiments, the present disclosure includes a method for controlling an operation of at least one switching element of a converter, in particular of a system for inductive power transfer. Further, the switching current of the at least one switching element of the converter is determined by a method according to one of the embodiments disclosed in this disclosure. Further, the switching element, in particular switching time points of the switching element, are controlled depending on the determined switching current. Further, an operation of the at least one switching element is controlled based on the determined switching current.

In some non-limiting embodiments, an operation of the switching element can be controlled such that a positive switching current is provided. Alternatively, the operation can be controlled such that a value of the switching current is within a predetermined current range, e.g. in a range from 1 to 3 A. The desired current range can however be dependent on the operation scenario.

It is also possible, to control the operation of the switching element such that an operating frequency, e. g. the fundamental frequency of the AC phase voltage is changed, in particular increased or decreased. Such a control may be possible if the fundamental frequency equals the switching frequency.

This advantageously allow to increase an operational safety of the converter comprising the at least one switching element.

BRIEF DESCRIPTION OF THE DRAWINGS

The present disclosure will be described with reference to the attached figures. The figures show.

DESCRIPTION OF THE INVENTION

In the following the same reference numerous denote elements with the same or similar technical features.

Figure 1:
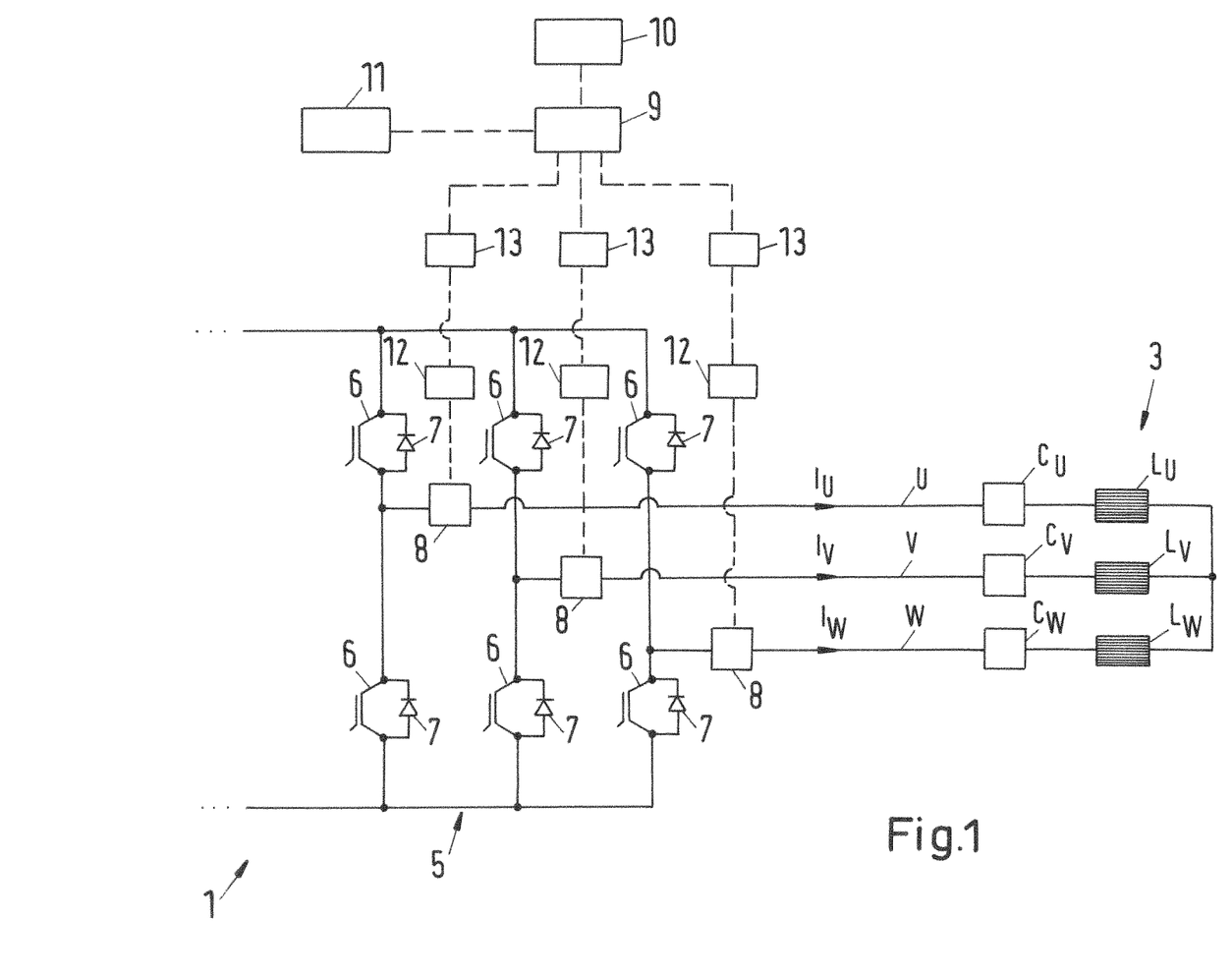
FIG. 1: A schematic block diagram of a device for determining a switching current.

FIG. 1 shows a schematic block diagram of a device 1 for determining a switching current of at least one switching element 6 of an inverter 5 of a system for inductive power transfer, in particular to a vehicle (not shown).

A primary unit (not shown) comprises the inverter 5 which is designed with a B6 bridge topology. The inverter 5 comprises switching elements 6, wherein a bypass diode 7 is connected antiparallel to each switching element 6. The inverter 5 has three legs, wherein each leg comprises a series connection of two switching elements 6. Further, a phase line U, V, W is connected to a connection section of the two switching elements 6.

In particular, a first switching element 6 is connected to a high potential phase line, wherein the second switching element 6 is connected to a low potential phase line.

The switching element 6 of the inverter can e.g. be provided by a MOSFED or an IBGT.

The inverter 5 generates or provides alternating current (AC) phase voltages for the phase lines U, V, W of the primary winding structure 3. AC output terminals of the inverter 5 are connected to the phase lines U, V, W, respectively. In the shown embodiment, these phase lines U, V, W of primary winding structure 3 are electrically connected to AC phase lines of the inverter 5. Thus, phase lines U, V, W also denote AC phase lines of the inverter 5.

The primary winding structure 3 is a three-phase winding structure. Schematically shown is an inductance $L_U, L_V, L_W$ provided by each phase line U, V, W. Further shown are compensating capacitances $C_U, C_V, C_W$ in each phase line U, V, W, wherein a capacitance value of said capacitances $C_U, C_V, C_W$ is chosen such that the resonant frequency of the resonant circuit provided by the inductance $L_U, L_V, L_W$ and the capacitance $C_U, C_V, C_W$ of each phase line U, V, W matches an operating frequency.

Further shown are AC phase currents $I_U, I_V, I_W$ in each phase line U, V, W which correspond to phase currents in AC phase lines of the inverter 5.

Further, the device 1 comprises current sensors 8 which measure the phase currents $I_U, I_V, I_W$ in each phase line U, V, W and thus the phase currents in the AC phase lines of the inverter 5. In particular, the phase current sensors 8 also measure the phase currents $I_U, I_V, I_W$ which flow through one switching element 6 of a leg of the inverter 5 into or out of the respective phase U, V, W.

In arrowhead of each phase current $I_U, I_V, I_W$ indicates a positive direction of the phase current $I_U, I_V, I_W$. A positive value of the phase current $I_U, I_V, I_W$ indicates a current flow with the indicated direction.

Further, the device 1 comprises an evaluation unit 9 which is connected to the current sensors 8 by a signal link (shown by dash lines). The evaluation unit 9 is connected to current sensors 8 by a low-pass filter unit 12 and an A/D converter unit 13, respectively. An A/D converter unit 13 can e. g. be a successive-approximation A/D converter unit or any other sample and hold A/D converter unit. The current sensors 8 provide samples of the measured phase current $I_U, I_V, I_W$, wherein these values are low-pass filtered. In some non-limiting embodiments, only some, but not all of the samples generated by the current sensors 8 are then digitized by the A/D converter units 13. A phase shift introduced by the current sensor 8, the low-pass filter 12 and the A/D converter unit 13 should be zero or as small as possible. Alternatively, the introduced phase shift of the phase current values may be considered in the method of determining a switching current.

Further, the device 1 comprises a memory unit 10 which is connected to evaluation unit 9 by a signal or a data link. Further shown is a control unit 11 for controlling an operation of the inverter 5, e.g. for controlling an operation of the switching elements 6. The control unit 11 is connected to the evaluation unit 9 by a signal or a data link. The control unit 11 can generate switch signals for the switching elements 6.

By means of the shown device 1, a phase current $I_U, I_V, I_W$ of phase line U, V, W of the inverter 5 can be measured by the current sensors 8. Further, at least one switching time point SP1, SP2, SP3 (see e.g. FIG. 3) of at least one switching element 6 and the phase current value $I_U, I_V, I_W$ at said switching time point SP1, SP2, SP3 can be determined, e.g. by the evaluation 9. It is possible that the evaluation 9 determines the switching time point SP1, SP2, SP3, wherein only the phase current value measured by the current sensor 8 at the switching time point SP1, SP2, SP3 is digitized by the A/D converter unit 13.

Further, a switching time point of the at least one switching element 6 is determined depending on the digitized phase current value.

A bandwidth of the current sensors 8 can be higher than 500 kHz. Further, a bandwidth of the A/D converter units 13 can be smaller than the bandwidth of the current sensors 8. The current sensor 8 can comprise a Rogowski coil or a current transformer.

Figure 2:
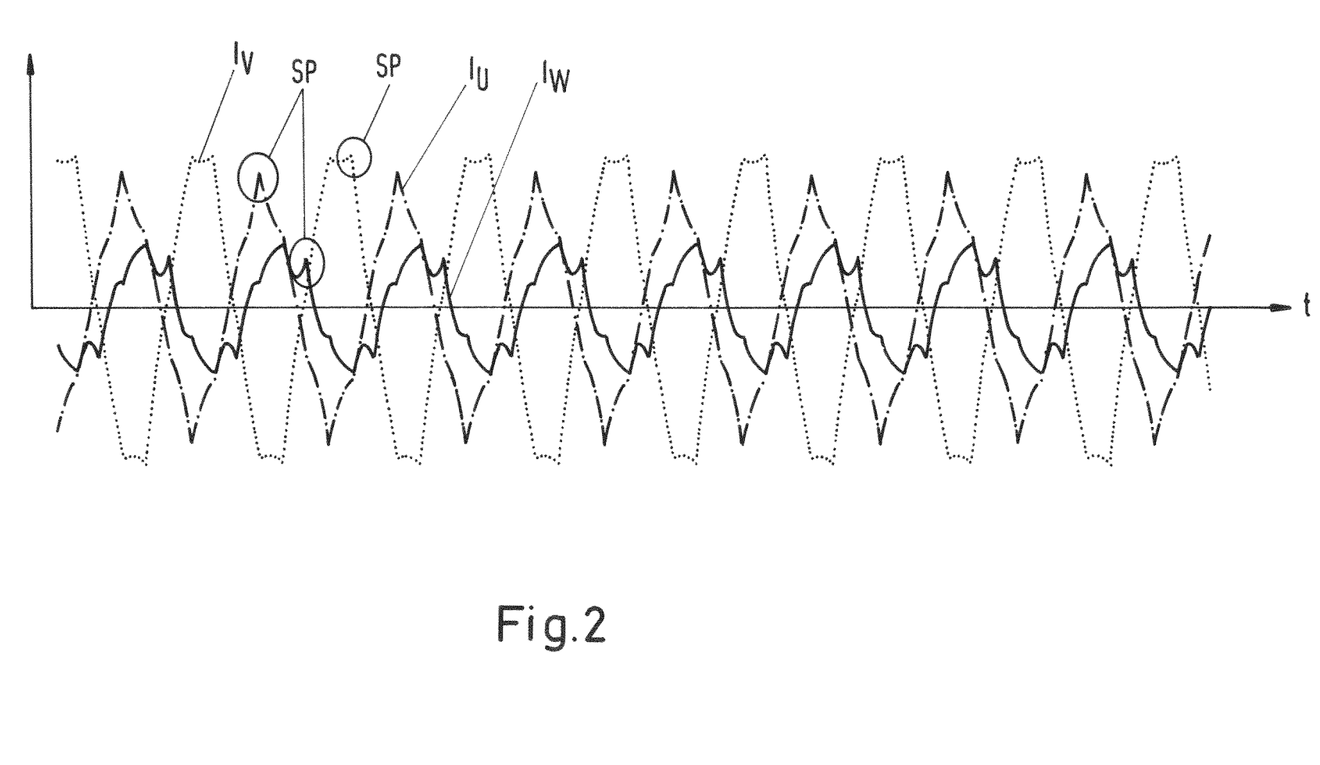
FIG. 2: An exemplary time course of phase currents in three AC phase lines of an inverter.

FIG. 2 shows an exemplary time course of phase currents $I_U, I_V, I_W$ over time t. The time course of each phase current $I_U, I_V, I_W$ is quasi-periodic, wherein the fundamental frequency corresponds to the operating frequency of the inverter 5, wherein each time course also contains higher order or so-called harmonic frequencies. Switching time points SP and corresponding phase current values are indicated by circles for each phase line U, V, W.

It is shown in FIG. 2 that a determination of the phase current value slightly before or after the actual switching time point can led to rather high deviations from a correct switching current because of the high current gradient provided around a switching time point SP.

Figure 3:
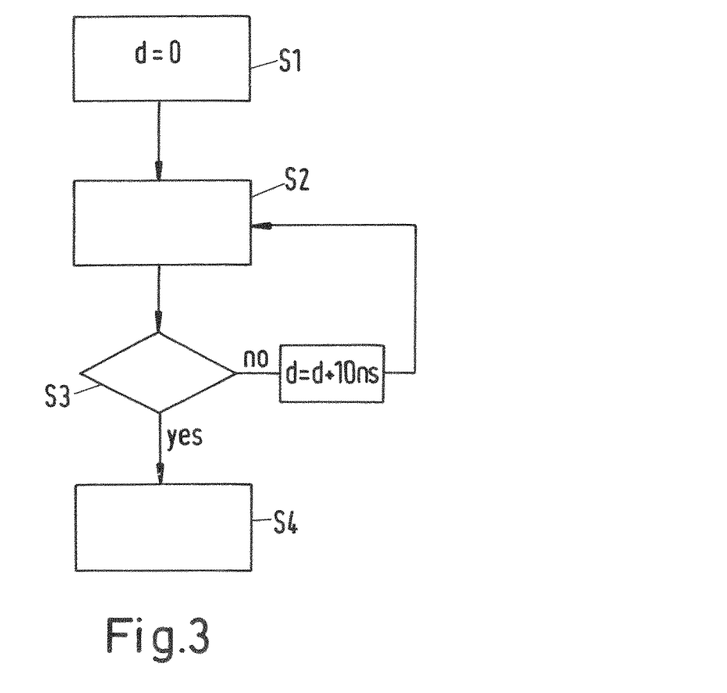
FIG. 3: An exemplary time course of switching signals and a phase current

FIG. 3 shows a schematic flow diagram of one preferred embodiment of the present disclosure. In a first step S1, an offset value d is set to zero or to another value, e.g. a value of 10 ns. In a second step S2, a first switching time point SP1 (see FIG. 4) is determine as a sum of a first time point SG1 of a switch signal generation for a switching element 6 (see FIG. 1) and the offset value d. Further, a first switching current SI1 is determined as the phase current value at this first switching time point SP1.

In a third step S3, it is checked if a predetermined number of switching cycles C1, C2, C3 (see FIG. 4) have been performed, e.g. five to ten switching cycles C1, C2, C3. If this is not the case, the offset valued is increased by e.g. 10 ns and the second step S2 is performed again. In particular, a second switching time point SP2 is determined as a sum of a second time point SG2 and the (increased) offset value d.

Further determined is a second switching current SI2 at this second switching time point SP2.

If a predetermined number of switching cycles has been performed, a set of multiple switching time points SP1, SP2, SP3 (see FIG. 4) and corresponding phase current values SI1, SI2, SI3 have been determined. This set and in particular its values can be stored in the memory unit 10 (see FIG. 1). Further, the switching current is determined as the local maximum of the course of phase current values SI1, SI2, SI3 for varying differences offset values d. The offset value d corresponds to a time difference between the switching time point SP1, SP2, SP3 and the time point of the corresponding switch signal generation SG1, SG2, SG3.

This is performed in a fourth step S4. Not shown is a control step wherein an operation of the inverter 5, in particular of a switching element 6 of the inverter 5, is controlled depending on the determined switching current.

Figure 4:
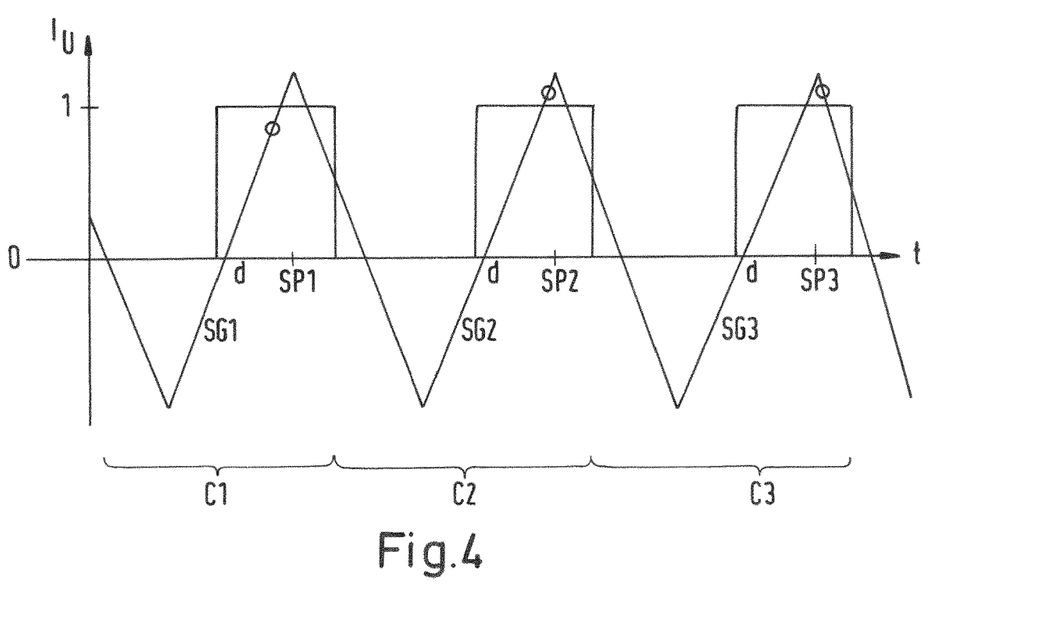
FIG. 4: A schematic flow diagram of a method for determining a switching current.

FIG. 4 exemplarily shows a time course of a phase current $I_U$ in the first phase line U (see FIG. 1) of the inverter 5 for three switching cycles C1, C2, C3. Further shown is a time course of a switch signal, wherein a switch signal representing a closed state of the controlled switching element 6 is indicated by a value "1" and a switch signal representing an opened state of the switching element 6 is indicated by a value "0".

Further shown are time points SG1, SG2, SG3 of a switch signal generation and increasing offset values d for the different switching cycles. It is possible that the control unit 11 generates the switch signals, wherein an information on the time points SG1, SG2, SG3 of a switch signal generation is transmitted to the evaluation unit 9. In the first switching cycle C1, the evaluation unit 9 adds a first offset value, e. g. a value of 10 ns to the first time point SG1 of a switch signal generation in order to determine the first switching time point SG1. Then, the A/D converter unit 13 is controlled such that the sample of the phase current value at this switching time point SG1 is digitized.

In the second switching cycle C2, the evaluation unit 9 adds an increased offset value d to the second time point SG2 of the switch signal generation in order to determine the second switching time point SP2. Then, the A/D converter unit 13 is controlled such that the sample of the phase current value at this switching time point SG2 is digitized. Third, in third switching cycle C3, the third switching time point SP3 is determine as the third time point SG3 of the switch signal generation and an further increased offset value d. Then, the A/D converter unit 13 is controlled such that the sample of the phase current value at this switching time point SG3 is digitized.

Based on the digitized phase current values, the switching current is determined.

The invention claimed is:

1. A method for operating a switching element of a converter of a system for inductive power transfer, wherein the method comprises the steps of:
    determining a phase current value of at least one AC phase line of the converter;
    determining at least one switching time point of the at least one switching element and the phase current value at said switching time point, wherein the switching time point is a point in time at which the at least one switching element changes from a non-conductive state to a conductive state or from the conductive state to the non-conductive state;
    determining a value of switching current of the at least one switching element depending on the phase current value; and
    controlling the at least one switching element based on the determined value of switching current of the at least one switching element such that the switching current of the at least one switching element is positive when the at least one switching element changes from the non-conductive state to the conductive state and negative when the at least one switching element changes from the conductive state to the non-conductive state.

2. The method of claim 1, wherein the phase current value is measured by a current sensor.

3. The method of claim 2, wherein a bandwidth of the current sensor is higher than 150 kHz.

4. The method of claim 3, wherein the phase current value is digitized by an A/D converter, and wherein a bandwidth of the A/D converter is smaller than the bandwidth of the current sensor.

5. The method of claim 2, wherein the current sensor comprises a Rogowski coil or a current transformer.

6. The method of claim 1, wherein a phase voltage change over time is determined, and wherein the phase current value is determined depending on the phase voltage change.

7. The method of claim 1, wherein a set of at least two successive switching time points of the at least one switching element and at least two phase current values at said at least two successive switching time points is determined, and wherein the at least one switching current is determined depending on the at least two phase current values.

8. The method of claim 7, wherein a first switching time point is determined depending on a first time point of a switch signal generation, wherein at least one further switching time point is determined depending on a further time point of a switch signal generation, and wherein a time difference between the at least one further switching time point and the further time point of a switch signal generation is different from the time difference between the first switching time point and the first time point of a switch signal generation.

9. The method of claim 8, wherein the time difference between a switching time point and the time point of a switch signal generation increases for successively determined switching time points.

10. The method of claim 9, wherein successive switching time points are determined by adding an increasing offset value to each of successively determined time points of a switch signal generation.

11. The method of claim 8, wherein the switching current is determined as the local maximum of the course of phase current values for the varying time differences.

12. The method of claim 7, wherein a predetermined number of successive switching time points are determined and/or all switching time points in a time interval of a predetermined length are determined.

13. The method of claim 1, wherein a first switching element voltage across a first switching element in one leg of the converter and a second switching element voltage across a second switching element in said leg of the converter are determined, wherein the first and the second switching element voltages provide input values of a XOR operation, wherein the switching time point is determined as the time point at which the output value of the XOR operation changes to a logic "1" signal, and wherein the switching current is determined as the phase current value at said switching time point.

14. A device for operating a switching element of a converter of a system for inductive power transfer, wherein the device comprises:

at least one means for determining at least one phase current value of at least one AC phase line of the converter; and at least one evaluation means;

wherein the at least one phase current value of at least one AC phase line of the converter is determinable;

wherein at least one switching time point of the at least one switching element and the at least one phase current value at said at least one switching time point is determinable, wherein the at least one switching time point is a point in time at which the at least one switching element changes from a non-conductive state to a conductive state or from the conductive state to the non-conductive state;

wherein the at least one switching current is determinable depending on the at least one phase current value; and wherein the device is to:

control the at least one switching element based on the at least one switching current of the at least one switching element such that the at least one switching current of the at least one switching element is positive when the at least one switching element changes from the non-conductive state to the conductive state and negative when the at least one switching element changes from the conductive state to the non-conductive state.

15. The device according to claim 14, further comprising:
a current sensor and/or at least one means for determining a phase voltage change over time.

16. The device according to claim 14, further comprising:
a control unit for generating switching signals for the at least one switching element.

17. The device according to claim 14, further comprising:
at least one means for determining a first switching element voltage across a first switching element in one leg of the converter and a second switching element voltage across a second switching element in said leg of the converter.

* * * * *